United States Patent [19]
Alberter et al.

[11] Patent Number: 5,909,353
[45] Date of Patent: Jun. 1, 1999

[54] CIRCUIT ARRANGEMENT FOR MUTUALLY INDEPENDANT SWITCHING OF SEVERAL INDUCTIVE SWITCHING UNITS IN PARALELL

[75] Inventors: Günther Alberter; Gunther Breu, both of Nürnberg; Wolfgang Gutbrod, Möhrendorf, all of Germany

[73] Assignee: Temic Telefunken microelectronic GmbH, Heilbronn, Germany

[21] Appl. No.: 08/908,313

[22] Filed: Aug. 7, 1997

[30] Foreign Application Priority Data

Aug. 10, 1996 [DE] Germany ............................ 196 32 365

[51] Int. Cl.⁶ .................................................. H01H 47/00
[52] U.S. Cl. ............................................ 361/191; 361/159
[58] Field of Search ............................ 361/159, 152–156, 361/191

[56] References Cited

U.S. PATENT DOCUMENTS

| | | | |
|---|---|---|---|
| 3,792,380 | 2/1974 | Murotani et al. ........................ | 361/159 |
| 4,129,816 | 12/1978 | Feldy et al. ............................. | 318/138 |
| 4,327,692 | 5/1982 | Harsch et al. ........................... | 123/490 |
| 4,677,117 | 6/1987 | Nebgen et al. . | |
| 4,733,326 | 3/1988 | Harch et al. ............................ | 361/159 |
| 4,949,215 | 8/1990 | Studtmann et al. ..................... | 361/154 |
| 5,036,422 | 7/1991 | Uchida et al. .......................... | 361/159 |
| 5,202,820 | 4/1993 | Miller et al. . | |
| 5,532,526 | 7/1996 | Ricco et al. ............................ | 307/104 |
| 5,621,604 | 4/1997 | Carlson .................................. | 361/166 |

FOREIGN PATENT DOCUMENTS

| | | |
|---|---|---|
| 0607030 A2 | 7/1994 | European Pat. Off. . |
| 0711910 A2 | 5/1996 | European Pat. Off. . |
| 3521983 | 1/1987 | Germany . |
| 02158366 | 9/1990 | Japan . |
| 97/04230 | 2/1997 | WIPO . |

Primary Examiner—Jeffrey Gaffin
Assistant Examiner—Kim Huynh
Attorney, Agent, or Firm—Venable; Geoge H. Spencer; Norman N. Kunitz

[57] ABSTRACT

A circuit arrangement for independently switching the induction coils of several d.c.-operated solenoid valves connected in parallel that, with a reduction of power loss, features a disconnection time which is independent of the voltage of the d.c. voltage source.

9 Claims, 2 Drawing Sheets

CIRCUIT ARRANGEMENT FOR MUTUALLY INDEPENDANT SWITCHING OF SEVERAL INDUCTIVE SWITCHING UNITS IN PARALELL

BACKGROUND OF THE INVENTION

In motor vehicles, systems are increasingly being integrated whose function is based on the rapid switching of inductive switching units with inductive loads. As a rule, these inductive loads are the induction coils of powerful, d.c.-operated solenoid valves. In order to switch off an inductive load quickly, it is necessary to transform the energy stored in its magnetic field as quickly as possible.

A commonly used circuit which accelerates the decay of the energy stored in an inductive load is a free-wheeling switch in series with a free-wheeling diode, the two together forming a free-wheeling circuit through which the inductive load can be short-circuited and which is connected in parallel to the inductive load and its main switch. In order to switch off the inductive load, the free-wheeling switch is closed at the same time as the main switch is opened. In so doing, the field strength of the magnetic field of the inductive load decays rapidly and the energy of the magnetic field is transformed into heat energy and as a result the switching off of the inductive load is completed at a faster rate. However, the energy stored in the inductive load is then completely lost; the power loss in the circuit arrangement is then maximum. Also, the free-wheeling circuit, in particular the free-wheeling switch, must be designed for the high voltage peaks that occur when the inductive load is short-circuited.

In circuit arrangements such as, for example, the so-called four-quadrant circuit according to U.S. Pat. No. 5,621,604 several inductive switch units, connected in parallel and supplied from a d.c. voltage source, can be switched independently of each other with a minimum of power loss. An inductive switch unit consists of an inductive load and a main switch between which a blocking diode, connected in the reverse direction to the minus pole, is contacted.

In the four-quadrant circuit, the power loss that occurs when switching off the inductive load is minimized by feeding back the current induced by the inductive loads in the circuit to the d.c. voltage source of the cicuit arrangement. Furthermore, the free-wheeling circuit, which is arranged with a free-wheeling diode in parallel to the inductive switch units, is connected through a free-wheeling switch to the minus pole of the d.c. voltage source.

When activating (i.e., allowing current to flow through) an inductive load, the main switch of the inductive switch unit concerned and the free-wheeling switch are closed. A current then flows from the d.c. voltage source through the main switch and the inductive load of the inductive switch unit concerned and through the free-wheeling switch to the minus pole of the d.c. voltage source.

After the free-wheeling switch has opened, the circuit arrangement is in the free-wheeling phase where the current flows in a closed circuit made up of the main switch and inductive load of the inductive switch unit concerned together with the free-wheeling diode.

To end the active circuit state of an inductive switch unit, the main switch of the inductive switch unit is opened. This causes the inductive load to induce a current in a circuit made up of the inductive load and the blocking diode of the inductive switch unit concerned together with the d.c. voltage source. As a consequence, the energy of the inductive load is fed back to the d.c. voltage source of the circuit arrangement with very little energy being transformed to heat and with a minimum loss of power in the circuit arrangement.

This circuit arrangement does, however, suffer from the serious disadvantage that the disconnecting time, within which the energy stored in the inductive load can be fed back to the d.c. voltage source, depends on the voltage of the d.c. voltage source of the circuit arrangement.

Consequently, the disconnecting time of the so-called four-quadrant circuit is increased drastically compared with the conventional circuit arrangement, especially when the d.c. voltage source supplies low voltages (below 20 volts).

The object of the invention is to provide an improved circuit arrangement that has advantageous properties with regard to the loading of the free-wheeling switch, the disconnecting time of the inductive load, and the power loss at the time of

SUMMARY OF THE INVENTION

In the circuit arrangement according to the invention for switching independently of each other several inductive loads connected in parallel, which circuit arrangement has a free-wheeling circuit, including a free-wheeling diode, connected in parallel with the inductive load units, and a free-wheeling switch connecting the free-wheeling circuit, at a junction between the inductive loads and the free-wheeling diode, to the minus pole of the d.c. voltage source, a switch group acting as switch is inserted in the free-wheeling circuit of the circuit arrangement for rapidly ending the active switched state, where on switching off at least one inductive switch group the free-wheeling circuit is blocked or remains at a high resistance level until the voltage has reached a threshold value at the junction to which the inductive load, the free-wheeling circuit and the free-wheeling switch are connected. If the threshold value is exceeded, the switch group in linear mode is driven, for example by a regulating circuit that monitors the voltage at the free-wheeling switch, to the point where the voltage in the junction no longer rises and the energy of the inductive load is fed back to the d.c. voltage source of the circuit arrangement. Consequently, part of the energy of the inductive load in the switch group is transformed to heat and part is fed back to the plus pole of the d.c. voltage source.

A metal oxide field effect transistor with suitable circuitry at its gate is used by preference as the switching medium for the switch group acting as switch in the free-wheeling circuit. This circuitry monitors the voltage at the junction and sets the threshold value.

Preferably, the threshold value up to which the free-wheeling circuit remains blocked is of an amount that is slightly below the maximum permissible voltage for the switch group acting as switch and/or the free-wheeling switch.

In an advantageous further development, the circuit arrangement can be made up of switches, diodes and the switch group as integrated circuit arrangement.

Because the voltage at the switch group of the free-wheeling circuit is limited to a defined voltage value, the disconnecting time of the circuit arrangement is constant, i.e. the disconnecting time is independent of the voltage of the d.c. voltage source of the circuit arrangement.

In a final advantageous further development of the invention, provision is made for controlling the current through the free-wheeling switch by means of pulse width modulation.

By imposing a threshold value on the switch group in the free-wheeling circuit and because of the possibility of feeding back the excess voltage to the d.c. voltage source of the circuit arrangement, the relationship between disconnecting time and power loss for protected switch group and/or protected free-wheeling switch can be selected at will.

The circuit arrangement for switching inductive loads is described below with reference to the drawing (FIGS. 1–3) on the basis of an embodiment example of the induction coils of d.c.-operated solenoid valves.

DETAILED DESCRIPTION OF PREFERRED EMBODIMENTS

Figure 1:
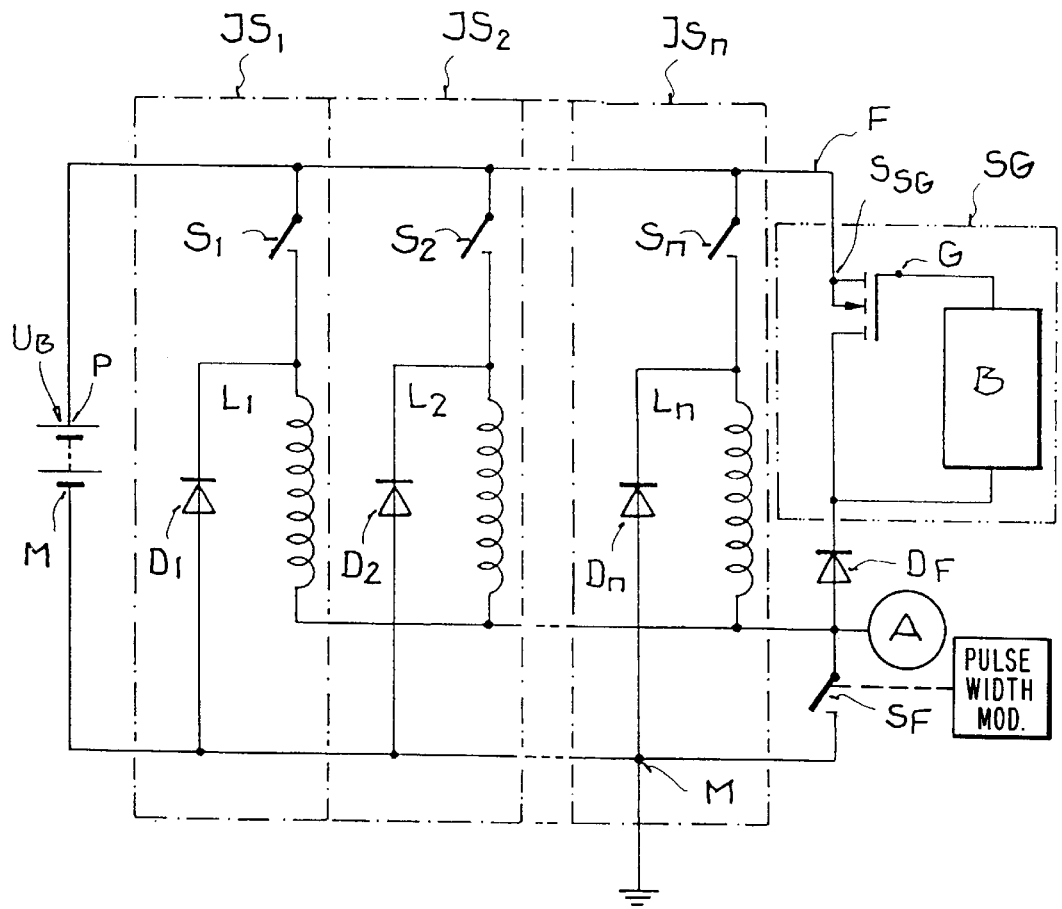
FIG. 1 is a schematic circuit diagram of the circuit arrangement for switching off induction coils of d.c.-operated solenoid valves.

FIG. 1 shows a schematic circuit diagram of the circuit arrangement for the independent switching of several inductive switch units connected in parallel IS1, IS2, . . . , ISn. The inductive switch units IS1, IS2, . . . , ISn consist of the respective main switches S1, S2, . . . , Sn, the respective induction coils L1, L2, . . . , Ln and the respective blocking diodes D1, D2, . . . , Dn each of which is contacted between a respective main switch S1, S2, . . . , Sn and a respective induction coil L1, L2, . . . , Ln and connected in the reverse direction with the minus pole M. The free-wheeling circuit F with a free-wheeling diode $D_F$, is connected in parallel to the inductive switch units IS1, IS2, . . . , ISn and is connected to the minus pole of the d.c. voltage source via a free-wheeling switch $S_F$. Between the d.c. voltage source UB and the junction A, a metal oxide field effect transistor $S_{SG}$ is inserted with a suitable circuitry B into the free-wheeling circuit F. When at least one inductive switch unit IS1, IS2, . . . , ISn is switched off, this transistor remains blocked until the voltage at the junction A has reached a threshold value.

On reaching the threshold value, the metal oxide field effect transistor $S_{SG}$ is driven in the linear mode by the circuitry B via gate G until the voltage at junction A no longer rises and remains constant.

The current in the induction coils L1, L2, . . . , Ln concerned now flows in a circuit comprising the free-wheeling diode $D_F$, the metal oxide field effect transistor $S_{SG}$, the d.c. voltage source UB and the relevant blocking diodes D1, D2, . . . , Dn.

A regulating circuit is provided as circuitry B of the metal oxide field effect transistor $S_{SG}$ between the junction A and the gate terminal G of the metal oxide field effect transistor $S_{SG}$ that monitors the voltage at the junction A and drives the metal oxide field effect transistor $S_{SG}$ via the gate terminal G in the linear mode when the threshold value preset by the circuitry B has been reached.

In order to accelerate the disconnection of one or several induction coils L1, L2, . . . , Ln, the threshold value is selected close to the maximum permissible voltage for the free-wheeling switch $S_F$. If the threshold value in the junction A is exceeded, the metal oxide field effect transistor $S_{SG}$ continues to be loaded with the voltage at the level of the threshold value and only the part in excess of this, induced by the induction coils L1, L2, . . . , L(n) in the free-wheeling circuit F, is fed back to the d.c. voltage source UB of the circuit arrangement.

For the free-wheeling switch $S_F$, therefore, disconnection of the induction coil(s) L1, L2, . . . , Ln is independent of the voltage of the d.c. voltage source UB of the circuit arrangement and independent of the energy stored in the induction coil(s) L1, L2, . . . , Ln.

At the same time, part of the energy stored in the induction coil(s) L1, L2, . . . , Ln is fed back to the d.c. voltage source UB of the circuit arrangement and part is transformed to heat in the metal oxide field effect transistor $S_{SG}$ of the free-wheeling circuit F.

Figure 2:
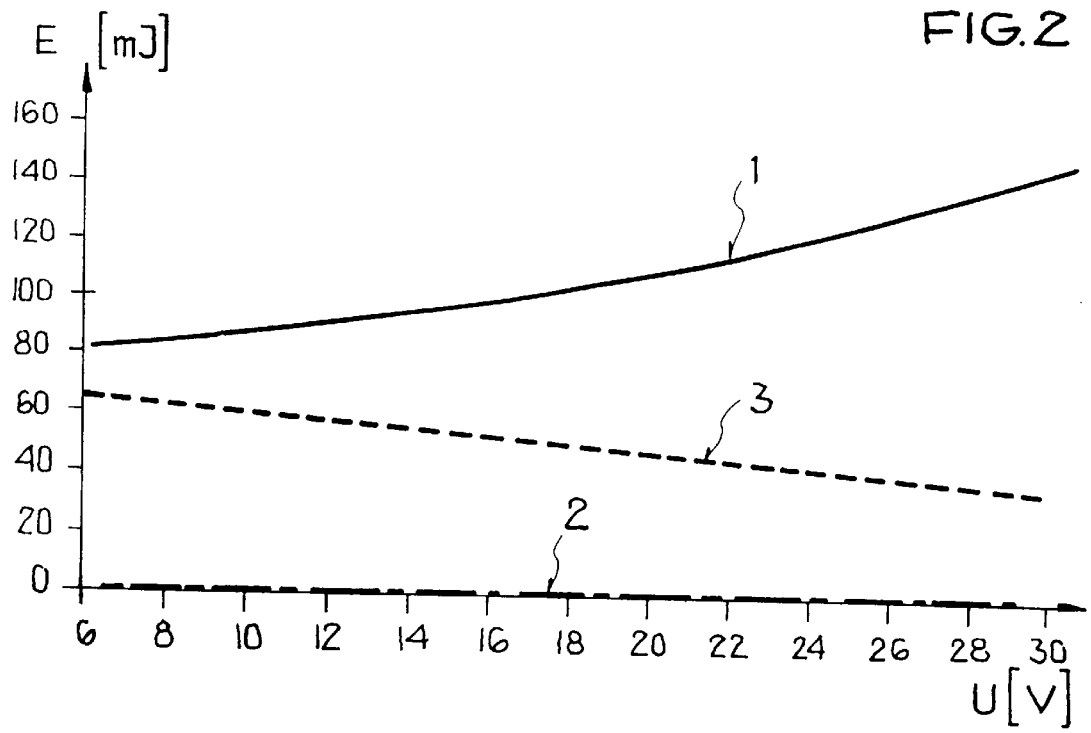
FIG. 2 is a chart comparing the energy transformed into heat in the switches of the free-wheeling circuits of the two conventional circuit arrangements named at the outset and the circuit arrangement in accordance with the invention, shown as a function of the d.c. voltage source.
Figure 3:
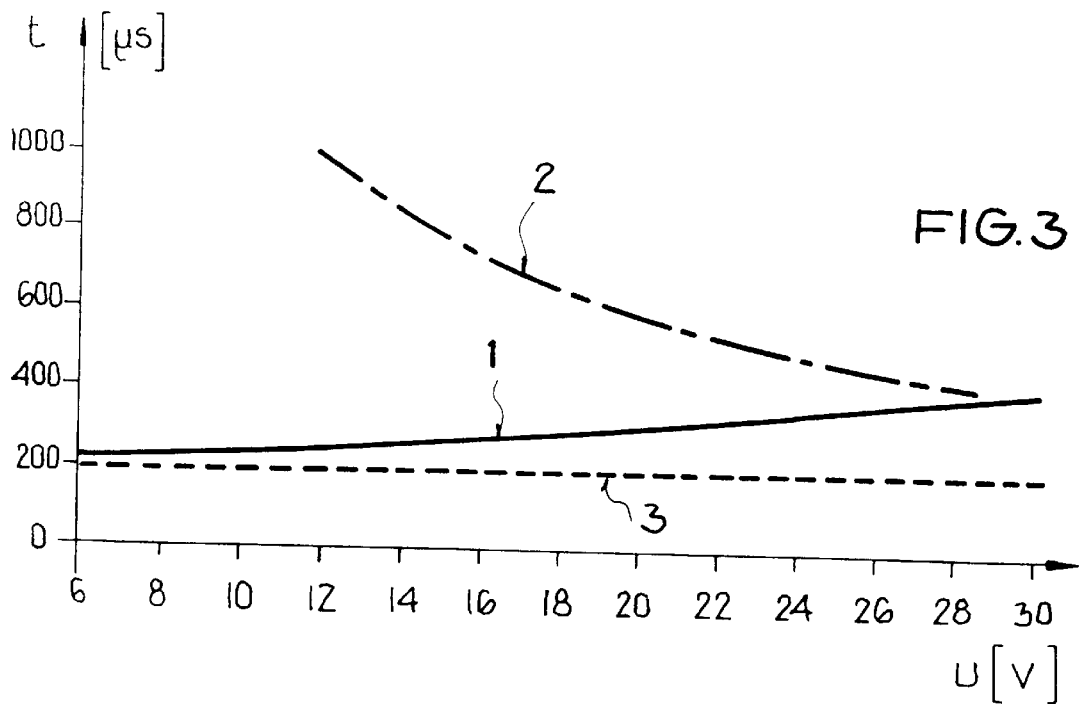
FIG. 3 is a chart comparing the disconnecting times of the solenoid valves of the two conventional circuit arrangements named at the outset and the circuit arrangement in accordance with the invention, shown as a function of the d.c. voltage source.

These two characteristics of the circuit arrangement according to the invention are shown in FIG. 2 and FIG. 3 as a comparison with the conventional circuit arrangements named at the outset.

In FIG. 2, the energy E of the induction coils transformed to heat in the switches of the free-wheeling circuits of the specified circuit arrangements is plotted in a graph against the voltage U of the d.c. voltage source UB. Curve 1 shows that the conventional circuit arrangement imposes an increasing load on the free-wheeling switch as the voltage U of the d.c. voltage source of the circuit arrangement rises.

Curve 2 for the so-called four-quadrant circuit reveals no power drop in the free-wheeling switch because the energy stored in the induction coils of the solenoid valves in the four-quadrant circuit is fed back to the d.c. voltage source of the circuit arrangement.

In the circuit arrangement according to the invention, there is a power drop in the metal oxide field effect transistor $S_{SG}$ of the free-wheeling circuit F, as shown in curve 3, but the power drop is less than in the conventional circuit arrangement and diminishes as the voltage U rises.

In FIG. 3, the disconnection times t of the named circuit arrangements are plotted in a graph against the voltage U of the d.c. voltage source UB. Curve 1 shows that the conventional circuit arrangement displays a disconnection time t of the solenoid valves that increases with the voltage U of the d.c. voltage source UB.

Curve 2 for the four-quadrant circuit shows that at low voltages U of the d.c. voltage source UB, especially under 20 volts, the disconnection time t of the solenoid valves increases to an extremely high level.

In the circuit arrangement according to the invention, the disconnection time t of the solenoid valves is constant and independent of the voltage U of the d.c. voltage source UB, as shown in curve 3.

Regulation of the current through the free-wheeling switch $S_F$ when current flows through the induction coils L1, L2, . . . , Ln can be effected by the pulse width modulation technique.

The circuit arrangement according to the invention thus allows the relationship between disconnection time and power loss of the circuit arrangement to be specified by appropriately setting the threshold value, for which purpose only one additional power component is required, namely the metal oxide field effect transistor $S_{SG}$.

What is claimed is:

1. Circuit arrangement with a d.c. voltage source for switching independently of each other several inductive switch units connected in parallel, wherein: each inductive switch unit is made up of an inductive load, a main switch and a blocking diode; the blocking diodes are connected to a common connection between the inductive loads and the main switches and connected in the reverse direction with the minus pole of the d.c. voltage sources; the inductive switch units are connected in parallel to a free-wheeling circuit including a free- wheeling diode; the free-wheeling circuit is connected, at a junction between the inductive loads and the free-wheeling diode, via a free-wheeling switch to the minus pole of the d.c. voltage source; and, in the free-wheeling circuit between the plus pole of the d.c. voltage source and said junctions, a switch group is arranged that blocks the free-wheeling circuit when at least one of the inductive switch units is disconnected until the voltage between the inductive loads and the switch group exceeds a threshold value at said junction.

2. Circuit arrangement in accordance with claim 1, wherein the inductive loads of the inductive switch units are inductive coils of solenoid valves.

3. Circuit arrangement in accordance with claim 1, wherein the switch group in the free-wheeling circuit has a metal oxide field effect transistor with a suitable circuitry.

4. Circuit arrangement in accordance with claim 1, wherein the threshold value is the maximum permissible voltage for the free-wheeling switch.

5. Circuit arrangement in accordance with claim 1, wherein free-wheeling switch, free-wheeling diode, blocking diodes and switch group are an integrated circuit arrangement.

6. Circuit arrangement in accordance with claim 1, wherein the disconnection time of the inductive switch units is independent of the voltage of the d.c. voltage source.

7. Circuit arrangement in accordance with claim 1, wherein part of the energy stored in the magnetic field of the inductive switch units is fed back to the d.c. voltage source.

8. Circuit arrangement in accordance with claim 1, wherein the current through the free-wheeling switch is regulated by means of pulse width modulation.

9. Circuit arrangement with a d.c. voltage source for switching, independently of each other, several inductive switch units, comprising: a plurality of inductive switch units connected in parallel, with each inductive switch unit including the series connection of an inductive load and a main switch, and a blocking diode which is connected between a common connection of the inductive load and the main switch and the minus pole of the d.c. voltage source in the reverse direction; a free-wheeling circuit, including a free-wheeling diode, connected in parallel with the inductive switch units; a free-wheeling switch connecting the free-wheeling circuit, at a junction between the inductive loads and the free-wheeling diode, to the minus pole of the d.c. voltage source; a controllable switch connected in the free-wheeling circuit between the plus pole of the d.c. voltage source and said junction; and a control circuit that controls the controllable switch to block the free-wheeling circuit when at least one of the inductive switch units is disconnected, by opening of the respective main switch, until the voltage between the inductive loads and the controllable switch at said junction exceeds a threshold value.

* * * * *